United States Patent
Kiziloglu et al.

(10) Patent No.: US 7,368,955 B2
(45) Date of Patent: May 6, 2008

(54) CURRENT-BALANCED LOGIC CIRCUIT

(75) Inventors: Kursad Kiziloglu, Granite Bay, CA (US); Michael W. Altmann, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 87 days.

(21) Appl. No.: 11/390,180

(22) Filed: Mar. 28, 2006

(65) Prior Publication Data

US 2007/0236258 A1     Oct. 11, 2007

(51) Int. Cl.
*H03F 3/45* (2006.01)

(52) U.S. Cl. .................. 327/51; 327/52; 327/53; 327/54; 327/55; 327/56; 327/57

(58) Field of Classification Search ............ None
See application file for complete search history.

(56) References Cited

U.S. PATENT DOCUMENTS

| | | | |
|---|---|---|---|
| 4,910,713 A | 3/1990 | Madden et al. | 365/189.11 |
| 5,124,589 A * | 6/1992 | Shiomi et al. | 326/43 |
| 5,216,295 A * | 6/1993 | Hoang | 326/115 |
| 6,014,043 A * | 1/2000 | Nishida | 327/65 |
| 6,756,823 B1 | 6/2004 | Chen et al. | 327/52 |
| 6,867,716 B2 * | 3/2005 | Zhang | 341/101 |
| 6,897,697 B2 * | 5/2005 | Yin et al. | 327/210 |
| 6,937,080 B2 * | 8/2005 | Hairapetian | 327/210 |
| 7,142,029 B2 * | 11/2006 | Gregory | 327/202 |
| 2004/0227544 A1 * | 11/2004 | Yin et al. | 327/65 |
| 2005/0242843 A1 * | 11/2005 | Meltzer et al. | 327/47 |
| 2005/0280460 A1 * | 12/2005 | Gregory | 327/218 |

OTHER PUBLICATIONS

Moisiadis et al., A High-Performance Low-Power Static Differential Double Edge-Triggered Flip-Flop, pp. IV-802-IV805; IEEE 0-7803-6685-9/01.
Hossain et al., "Low Power Design Using Double Edge Triggered Flip-Flops", IEEE Transactions on Very Large Scale Integration (VLSI) Systems, vol. 2, No. 2, Jun. 1994.
Strollo et al., "Low power double edge-triggered flip-flop using one latch", Electronics Letters, Feb. 4, 1999; vol. 35, No. 3, pp. 187-188.
Allam et al., "Dynamic Current Mode Logic (DyCML): A New Low-Power High-Performance Logic Style", IEEE Journal of Solid-State Circuits, vol. 36, No. 3, Mar. 2001, pp. 550-558.
Lu et al., "A Novel CMOS Implementation of Double-Edge-Triggered Flip-Flops", IEEE Journal of Solid-State Circuits, vol. 25, No. 4, Aug. 1990; pp. 1008-1010.
Mishra et al., "Design of high performance double edge-triggered flip-flops", IEE Proc.-Circuits Devices Syst., vol. 147, No. 5, Oct. 2000, pp. 283-290.
Afghahi et al., "Double Edge-Triggered D-Flip-Flops for High-Speed CMOS Circuits", IEEE Journal of Solid-State Circuits, vol. 26, No. 8, Aug. 1991, pp. 1168-1170.

* cited by examiner

*Primary Examiner*—Tuan T. Lam
*Assistant Examiner*—Hiep Nguyen
(74) *Attorney, Agent, or Firm*—Ked & Associates, LLP

(57) ABSTRACT

In accordance with some embodiments, a current-balanced logic circuit includes a first sense amplifier, a second sense amplifier, and a current-source transistor which provides bias current to the first and second sense amplifiers. The first and second sense amplifiers are alternately activated by first and second differential clock signals, and when activated convert data received on differential input lines into logical values for storage in respective storage circuits. The storage circuits may be flip-flops, latches, keeper circuits, or other circuits for storing data.

13 Claims, 5 Drawing Sheets

CURRENT-BALANCED LOGIC CIRCUIT

FIELD

The present invention relates in at least some of its embodiments to logic circuits.

BACKGROUND

Communication systems are constantly evolving to, for example, transfer and process information at faster rates. This may be accomplished by improving data-rate compatibility between communication interfaces and internal logic circuits of a receiver or transmitter.

Generally, as the bit rates of communication interfaces (e.g., Fiber Channel, Peripheral Component Interconnect (PCI)-Express, Serial Advanced Technology Attachment (SATA)) increase, the task of developing faster logic circuits becomes more challenging. These logic circuits include data storage elements and samplers as well as others found in the front end of receivers. Designers often seek to improve the efficiency of communications between these elements, and further seek to reduce power consumption particularly in clocking networks that support the interface and logic circuits of communication systems running at high bit rates.

DETAILED DESCRIPTION

Figure 1:
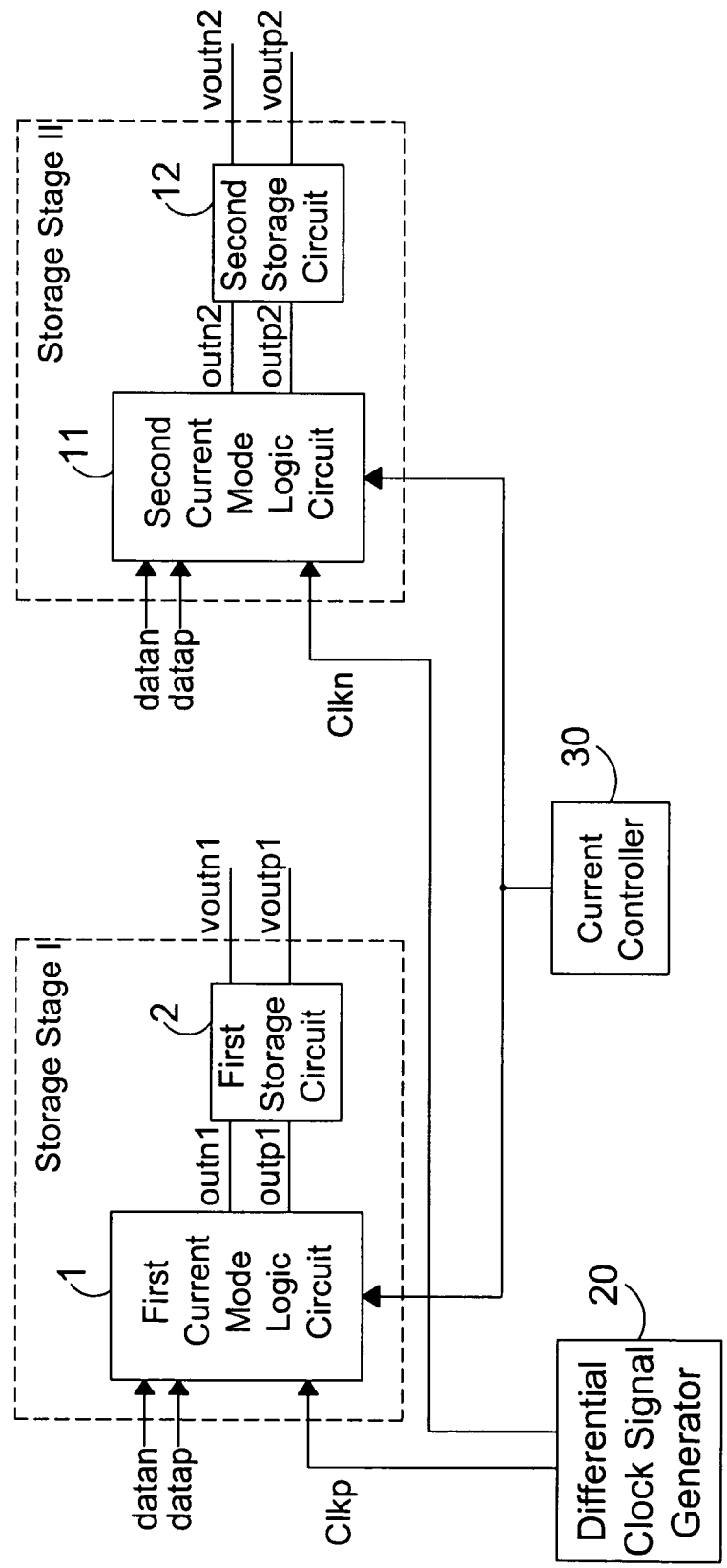
FIG. 1 is a diagram of a current-balanced logic circuit in accordance with one embodiment of the present invention.

FIG. 1 shows a current-balanced logic circuit in accordance with one embodiment of the present invention. This circuit includes a first current-mode logic circuit 1 coupled to a first storage circuit 2, and a second current-mode logic circuit 11 coupled to a second storage circuit 12. In accordance with this embodiment, each of the first and second current-mode logic circuits performs a sense operation, which involves sensing a voltage difference between differential data signals, datan and datap, and then converting or amplifying that difference to a logical value of 1 or 0. The first and second storage circuits respectively store the outputs of the first and second current-mode logic circuits until, for example, they are output for use in an intended application.

In FIG. 1, the output of the first current-mode logic circuit 1 is shown as a pair of differential signals, outn1 and outp1, and the output of the first storage circuit 2 is shown as a pair of differential signals, voutn1 and voutp1. The output of the second current-mode logic circuit 11 is shown as a pair of differential signals, outn2 and outp2, and the output of the second storage circuit 12 is shown as a pair of differential signals, voutn2 and voutp2.

Figure 2:
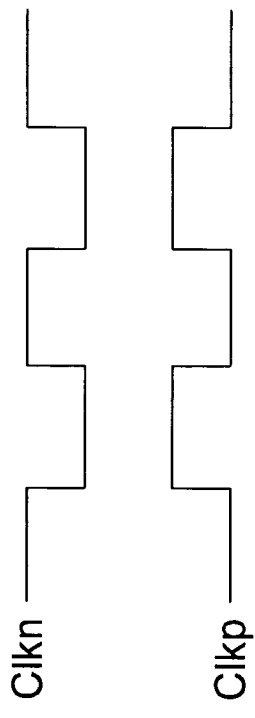
FIG. 2 is a timing diagram of differential clock signals that may be used to control different stages of a current-balanced logic circuit in accordance with an embodiment of the present invention.

The first and second current-mode logic circuits are alternately controlled by a differential pair of clock signals, illustratively shown in FIG. 2 as clkp and clkn. The first differential clock signal, clkp, controls the first current-mode logic circuit and the second differential clock signal, clkn, controls the second current-mode logic circuit. Because the differential clock signals are out of phase relative to one another, the first and second current-mode logic circuits are alternately activated. As a result, the first and second storage circuits may store and/or output their respective data signals at different times. The differential clock signals may be generated by differential clock signal generator 20 and may be out of phase by 180° or another angle.

In addition to the foregoing features, a current controller 30 may be included to control, or bias, the current into the first and second current-mode logic circuits. In this embodiment, controller 30 includes a current-source transistor which is alternately coupled to the first and second current-mode logic circuits, for example, by respective ones of the differential clock signals. Through this alternate coupling, controller 30 is able to balance the control of bias or reference current to the current-mode logic circuit in each respective storage stage I and II. In this embodiment, controller 30 may deliver a same amount of bias or reference current to each stage, while in other embodiments this amount may differ. For some applications, applying the same amount of current to each stage may increase power supply, substrate, and common-mode noise immunity. In other embodiments, the current may be varied or set to achieve a different level of performance depending, for example, on the intended application.

Figure 3:
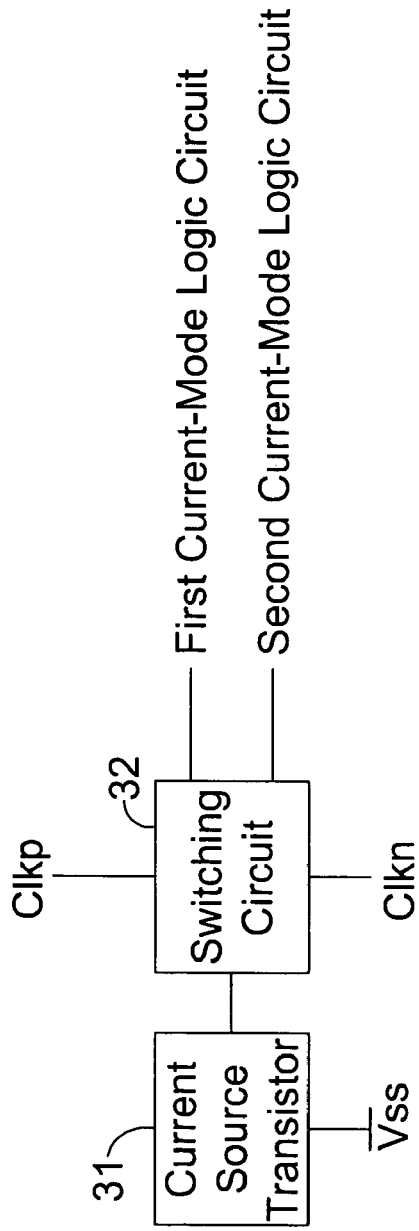
FIG. 3 is a diagram of a current controller in accordance with one embodiment of the present invention.

FIG. 3 shows one example of how current controller 30 may be constructed for purposes of distributing current between the storage stages in a balanced manner. In this example, the controller includes a supply current rail, Vss, coupled to a current-source transistor 31. Current from this transistor (which corresponds to the bias or reference current) is input into a switching circuit 32, which alternately passes the current to storage stages I and II based on the differential clock signals. For example, differential clock signal, clkp, may cause the switching circuit to output current to storage stage I (and specifically first current-mode logic circuit 1) when clkp assumes a first logical value. Differential clock signal, clkn, may cause the switching circuit to output current to storage stage II (and specifically second current-mode logic circuit 2) when clkn assumes a second logical value. By appropriately selecting the parameters of transistor 31 and setting Vss to a predetermined value, the amount of bias or reference current supplied to the storage stages may be precisely controlled. In other embodiments, more complex bias generation and mirroring techniques may be used in place of the current-source transistor 31. Some of these different circuits include but are not limited to a cascode or a wide-swing cascode structure.

Figure 4:
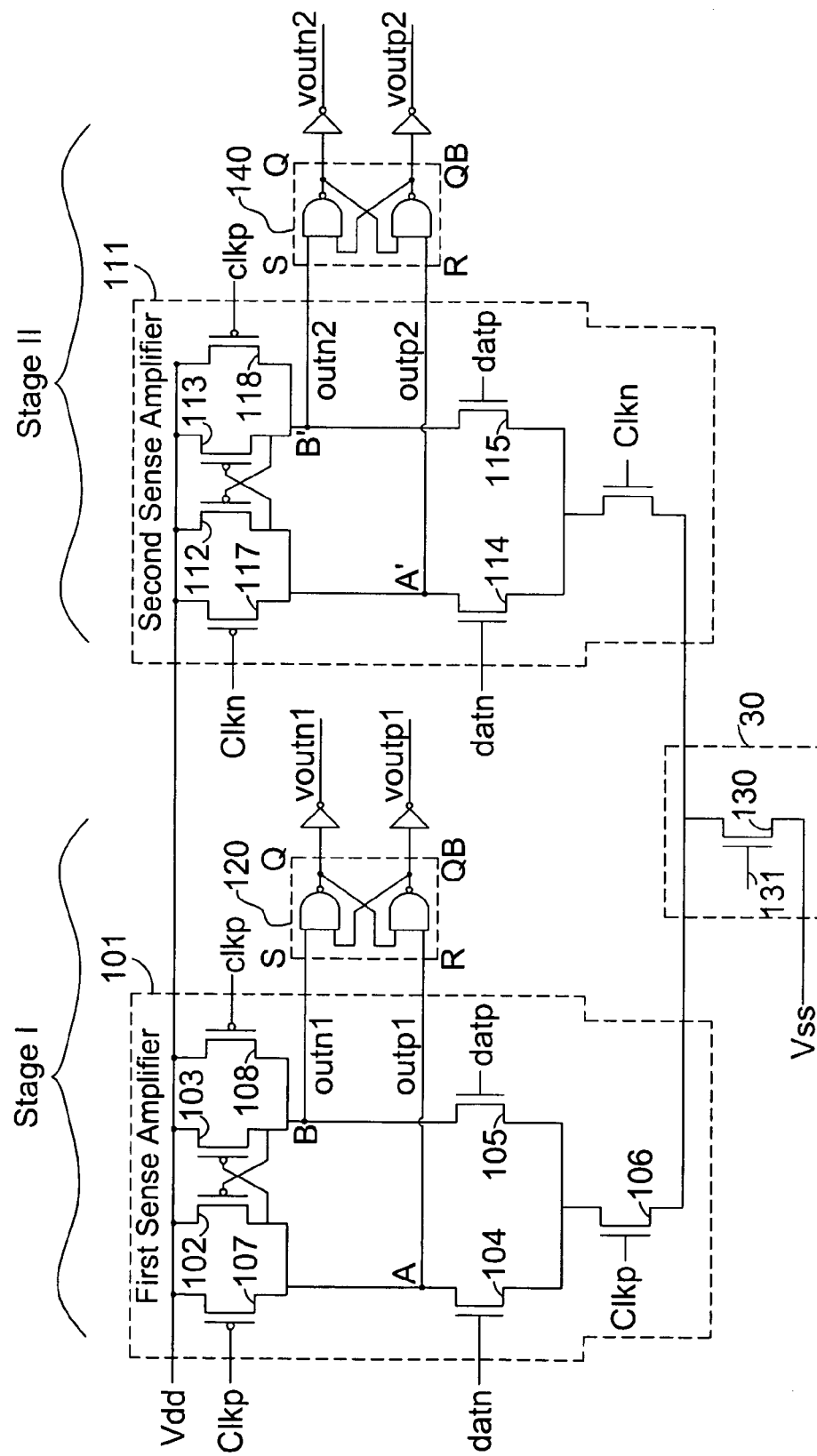
FIG. 4 is a diagram of a current-balanced logic circuit in accordance with an embodiment of the present invention.

FIG. 4 shows another embodiment of a current-balanced logic circuit in accordance with the present invention. This embodiment may have some elements in common with the embodiment shown in FIG. 1, and where applicable similar reference numerals and labels have been used. The FIG. 4 embodiment, however, may be considered more detailed in that it includes specific non-limiting examples of how the first and second current-mode logic circuits and the current controller may be constructed.

In this embodiment, the first current-mode logic circuit may be constructed to include a first sense amplifier 101 for converting a difference between differential data signals, datn and datp, into one of two logical values. The first sense amplifier is formed from cross-coupled transistors 102 and 103, each having a source coupled to voltage rail Vdd and a drain coupled to the gate of the other transistor. The drains of transistors 102 and 103 are also respectively coupled to the drains of transistors 104 and 105, and each of these latter transistors has a gate coupled to receive a corresponding one of the differential data signals. The sources of transistors 104 and 105 may be coupled to the drain of a single transistor 106, which operates as a sense enable element of the circuit. In this embodiment, transistors 102 and 103 are p-type metal oxide semiconductor (PMOS) devices and transistors 104, 105, and 106 are n-type metal oxide semiconductor (NMOS) devices. In other embodiments, the conductivities of these transistors may be different.

The first sense amplifier may also include two additional transistors 107 and 108. These transistors are PMOS devices connected in parallel to transistors 102 and 103 respectively. That is, transistor 107 has a drain commonly connected to the drain of transistor 102 and the drain of transistor 104, and a source coupled to voltage rail Vdd. Transistor 108 has a drain commonly connected to the drain of transistor 103 and the drain of transistor 105, and a source coupled to voltage rail Vdd. The gates of these transistors are coupled to receive the same differential clock signal, clkp. This clock signal also serves as a sense enable input into the gate of transistor 106, the effect of which will be described in greater detail below.

The first sense amplifier has two outputs, outn1 and outp1, that serve as data inputs into a storage circuit 120, which, for example, may be or include a flip-flop or latch. These data inputs emanate from nodes A and B coupled between transistors 102 and 104 and transistors 103 and 105 respectively. In this embodiment, storage circuit 120 is shown as an SR flip-flop. When implemented in this manner, data are transferred based on the following truth table:

| S | R | Q(n+1) |
|---|---|--------|
| 0 | 1 | 1 |
| 1 | 0 | 0 |
| 1 | 1 | Q(n) |
| 0 | 0 | Not allowed |

As shown in the table, after a certain gate delay, the Q output of the SR flip-flop is set to 1 if the S input is equal to 0 and the R input is equal to 1. Conversely, the Q output of the SR flip-flop is set to 0 if the S input is equal to 1 and the R input is equal to 0. If S=R=1, then the SR flip-flop preserves its previous value, shown as Q(n). In certain embodiments the combination of S=R=0 may not be allowed, while in other embodiments this combination may be permissible.

While an SR flip-flop may be suitable for use in some embodiments, storage circuit 120 may be implemented based on a different type of flip-flop, latch, or storage circuit in other embodiments. These different circuits include but are not limited to keeper circuits. The data stored in the SR flip-flop is output along lines voutn1 and voutp1, for example, in accordance with a timing set by differential clock signal clkp. For some applications, these outputs may be considered as pseudo-differential complementary metal oxide semiconductor (CMOS) output signals.

Because transistor 106 and transistors 107 and 108 are of opposite conductivities, transistor 106 will be off when transistors 107 and 108 are turned on and vice versa. This allows the first sense amplifier to achieve at least two results. First, the sense amplifier 101 will be de-activated when clkp is low. At this time, transistors 107 and 108 will turn on to thereby form shorts across transistors 102 and 103. This effectively isolates transistors 102 and 103 from the rest of the circuit and the SR flip-flop, while simultaneously driving output lines outn1 and outp1 high. Because the SR flip-flop is formed from NAND gates, driving lines outn1 and outp1 high will not change the logical value stored in the SR flip-flop. At the same time, driving these lines high will pre-charge outn1 and outp1 for the next storage operation. (The use of NAND gates to form the SR flip-flop is merely illustrative of this embodiment of the invention, as other combinations of gates may alternatively be used.)

Second, the first sense amplifier will be activated when clkp is high. The high value of clkp may serve as an enable signal which turns on transistor 106 to set the first sense amplifier in a ready state for storing data in the flip-flop. At this time, transistors 107 and 108 are turned off. As a result, transistors 102 and 103 are no longer isolated from the circuit and can operate to convert (or amplify) the difference between the differential data signals, datn and datp, into one of two logical values.

The second current-mode logic circuit may be constructed in a manner similar to the first current-mode logic circuit. That is, the second current-mode logic circuit may be constructed to include a second sense amplifier 111 for converting a difference between differential data signals, datn and datp, into one of two logical values.

The second sense amplifier is formed from cross-coupled transistors 112 and 113, each having a source coupled to voltage rail Vdd and a drain coupled to the gate of the other transistor. The drains of transistors 112 and 113 are also respectively coupled to the drains of transistors 114 and 115, and each of these latter transistors has a gate coupled to receive a corresponding one of the differential data signals. The sources of transistors 114 and 115 are then coupled to the drain of a transistor 116, which operates as a sense enable element of the circuit. In this embodiment, transistors 112 and 113 are PMOS devices and transistors 114, 115, and 116 are NMOS devices. In other embodiments, the polarities of these transistors may be different. Also, data signals datn and datp may be the same differential signals input into the first sense amplifier or these signals may be different.

In addition to these features, the second sense amplifier may include two additional transistors 117 and 118. These transistors are PMOS devices connected in parallel to transistors 112 and 113 respectively. That is, transistor 117 has a drain commonly connected to the drain of transistor 112 and the drain of transistor 114, and a source coupled to voltage rail Vdd. Transistor 118 has a drain commonly connected to the drain of transistor 113 and the drain of transistor 115, and a source coupled to voltage rail Vdd. The gates of these transistors are coupled to receive the same differential clock signal, clkn. This clock signal also serves as a sense enable input into the gate of transistor 116, the effect of which will be described in greater detail below.

The second sense amplifier has two outputs, outn2 and outp2, which serve as data inputs into a storage circuit 140, which, for example, may be or include a flip-flop or latch. These inputs emanate from nodes A' and B' coupled between transistors 112 and 114 and transistors 113 and 115 respectively. In this embodiment, storage circuit 140 is shown as an SR flip-flop. (In other embodiments, a different type of flip-flop, latch, or storage circuit may be used.) The data stored in the SR flip-flop is output along lines voutn2 and voutp2, for example, in accordance with a timing set by differential clock signal clkn.

Because transistor 116 and transistors 117 and 118 are of opposite conductivities, transistor 116 will be off when transistors 117 and 118 are turned on and vice versa. This allows the second sense amplifier to achieve at least two results. First, the second sense amplifier will be de-activated when clkn is low. At this time, transistors 117 and 118 will turn on to thereby form shorts across transistors 112 and 113. This effectively isolates transistors 112 and 113 from the rest of the circuit and the SR flip-flop, while simultaneously driving output lines outn2 and outp2 high. Because the SR flip-flop is formed from NAND gates, driving lines outn2 and outp2 high will not change the logical value stored in the SR flip-flop. At the same time, driving these lines high will pre-charge outn2 and outp2 for the next storage operation. (The use of NAND gates to form the SR flip-flop is merely illustrative of this embodiment of the invention, as other combinations of gates may alternatively be used.)

Second, the second sense amplifier will be activated when clkn is high. The high value of clkn serves as an enable signal which turns on transistor 116 to set the second sense amplifier in a ready state for storing data in the SR flip-flop. At this time, transistors 117 and 118 are turned off. As a result, transistors 112 and 113 are no longer isolated from the circuit and can operate to convert (or amplify) the difference between data signals, datn and datp, into one of two logical values.

The current-balanced logic circuit of FIG. 4 further includes a current-source transistor 130, which may correspond to or be included in the current controller 30 in FIG. 1. This transistor has a drain coupled to the sources of transistors 106 and 116 and a source coupled to supply rail Vss. A gate of transistor 130 is further coupled to receive a control signal 131. When turned on by this signal, transistor 130 serves as a constant source of bias or reference current for sense amplifiers 101 and 111. This bias or reference current is alternately applied to the first and second sense amplifiers because transistors 106 and 116 are driven by different differential clock signals, clkn and clkp.

Control signal 131 may correspond, for example, to a constant bias voltage, a changing bias voltage, or an enable signal that is switched on and off to control shut down of the entire circuit. These signals may be applied all the time or at regular intervals, or the signals may be gated signals which in the latter case described above may be used to enable and disable the entire circuit.

If signal 131 is a changing bias voltage, the voltage may change, for example, based on the type of biasing circuit chosen. One example of a biasing circuit that may be used is a constant gm—transconductance—biasing circuit which adjusts the gate voltage to accomplish a constant transistor gm across power supply and temperature corners. A different biasing circuit may be used in other embodiments. Also, in other embodiments, the current source in controller 30 may be formed from more than one transistor, e.g., the current source may be formed from a current mirror, a cascode, a wide-swing cascode, or any other appropriate biasing/sourcing arrangement.

As shown in FIG. 4, the first and second sense amplifiers are controlled by different ones of the differential clock signals, clkn and clkp, respectively. Because clkn and clkp are out of phase with one another, the first sense amplifier and storage circuit (e.g., SR flip-flop) 120 will perform their sensing and storage functions when the second sense amplifier and storage circuit (e.g., SR flip-flop) 140 are de-activated, and vice versa. The differential clock signals therefore serve to alternately activate stages I and II of the current-balanced logic circuit of FIG. 4. Also, the first and second sense amplifiers are biased (or receive the same reference current) in a balanced manner through current-source transistor 130. All of these features allow stages I and II of the current-balanced logic circuit to operate as a single flip-flop but at half the input data rate.

For some applications, the current-balanced logic circuit may also permit clocking networks to run at half data rates with excellent noise immunity. Resilience to PMOS-NMOS transistor mismatches is also achievable in many implementations. This allows host circuits such as communication receivers running at high bit rates (e.g., 10 Gb/s) to have a less-constrained design while achieving significant power savings. Moreover, these improvements may be realized without using buffers, capacitors, and pass gates which tend to limit circuit performance in terms of, for example, drive capability, size, leakage current, bit rates, and phase differences that translate into clock skews.

When applied in sampling circuits especially, the current-balanced logic circuit may be implemented, for example, to allow direct use of differential half-rate clock signals from high-speed (e.g., multi-GHz) and low-jitter voltage-controlled oscillators (VCOs) and phase-locked loops (PLLs). These half rate clock signals may be obtained, for example, by using divide-by-2 circuitry from the low-jitter VCOs or PLLs, thereby approaching or attaining certain (e.g., 50%) duty cycles of the clock and in some cases eliminating the need for duty-cycle correctors (DCCs). This may be especially beneficial in high-sensitivity receiver applications as well as others. In some instances, the current-balanced logic circuit may also realize a shorter regeneration time and therefore a narrower region of metastability.

Figure 5:
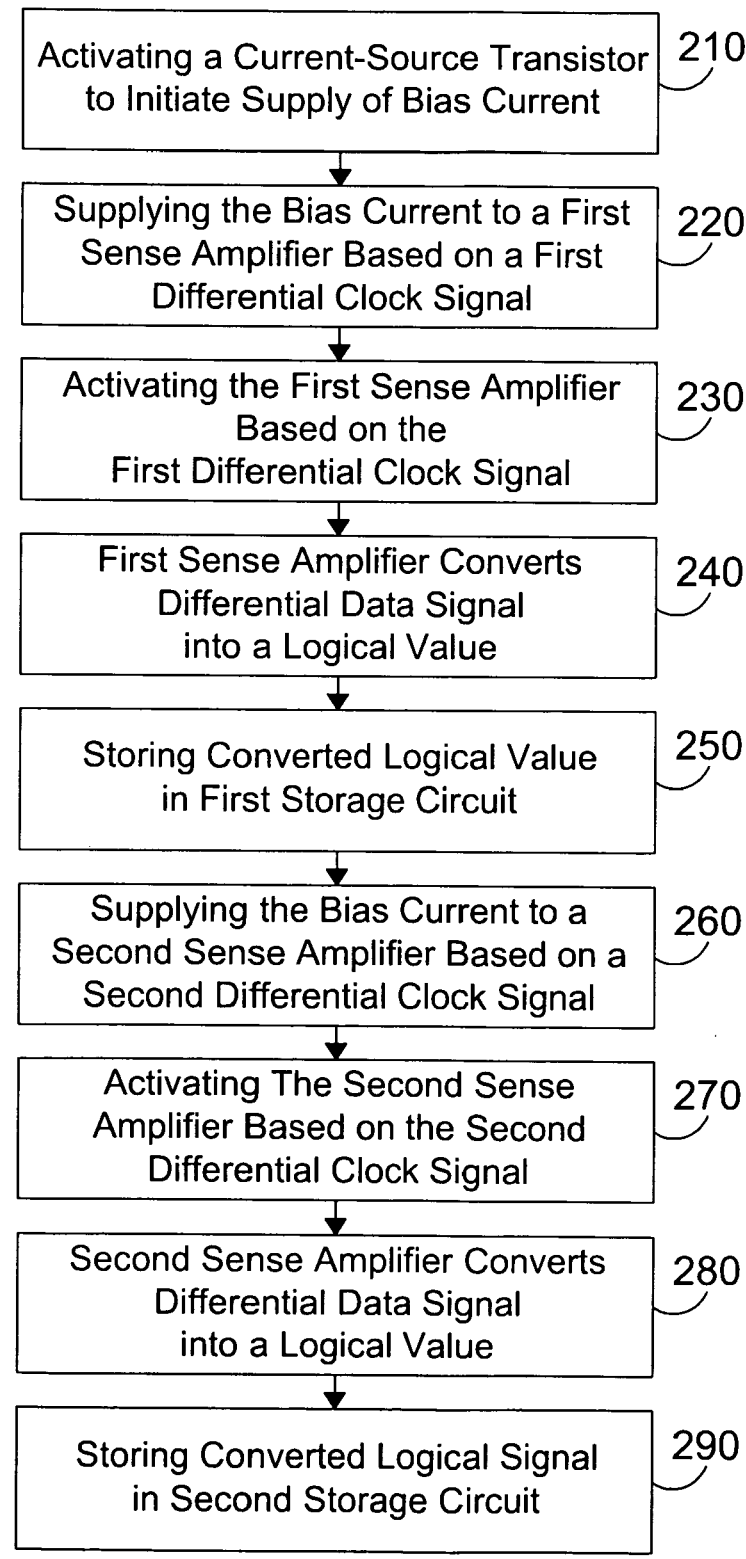
FIG. 5 is a diagram of blocks included in a method for controlling a current-balanced logic circuit in accordance with one embodiment of the present invention.

FIG. 5 shows a method for controlling a current-balanced logic circuit in accordance with one embodiment of the present invention. The current-balanced logic circuit may be one such as shown in FIGS. 1 or 4 or may be another type. For illustrative purposes, the method will be described relative to the circuit shown in FIG. 4.

Initially, control signal 131 is applied to the gate of current-source transistor 130 to provide a same bias or reference current to the first and second sense amplifiers 101 and 111. (Block 210) This signal may be constantly applied or applied according to some predetermined control or timing schedule. Once transistor 130 is activated (e.g., turned on), the differential clock signals clkp and clkn are applied to alternately activate stage I and II of the current-balanced logic circuit.

In stage I, differential clock signal clkp is applied as a gate signal into transistor 106. When clock signal clkp assumes a high value, transistor 106 allows the bias or reference current to be supplied from current-source transistor 130 to the first sense amplifier. (Block 220).

The first sense amplifier is also activated, or enabled, to perform a sensing operation when clock signal clkp assumes a high value. (Block 230). The first sense amplifier is activated based on the state of transistors 107 and 108. When clock signal clkp assumes a high value, transistors 107 and 108 are turned off. (In its previous low state, clkp operated to pre-charge the input lines, outn1 and outp1, into storage circuit 120.) Turning off transistors 107 and 108 removes the isolation on transistors 102 and 103, thereby allowing the first sense amplifier to convert the voltage difference on differential data lines datan and datap into one of two logical values (Block 240). The converted value is stored in storage circuit (e.g., SR flip-flop) 120 and subsequently output on lines voutn1 and voutp1. (Block 250). At this time, the low value of differential clock signal clkn serves to de-activate second sense amplifier 111 and thus block input of current from the current-source transistor.

In stage 2, differential clock signal clkn is applied as a gate signal into transistor 116. When clock signal clkn assumes a high value, transistor 116 allows the bias or reference current to be supplied from current-source transistor 130 to the second sense amplifier. (Block 260).

The second sense amplifier is also activated, or enabled, to perform a sensing operation when clock signal clkn assumes a high value. (Block 270). The second sense amplifier is activated based on the state of transistors 117 and 118. When clock signal clkn assumes a high value, transistors 117 and 118 are turned off. (In its previous low state, clkn operated to pre-charge the input lines, outn2 and outp2, into storage circuit 140.) Turning off transistors 117 and 118 removes the isolation on transistors 112 and 113, thereby allowing the second sense amplifier to convert the voltage difference on differential data lines datan and datap into one of two logical values (Block 280). This data value is then stored in storage circuit (e.g., SR flip-flop) 140 and subsequently output on lines voutn2 and voutp2. (Block 290). At this time, the low value of differential clock signal clkp serves to de-activate first sense amplifier 101 and thus block input of current from the current-source transistor.

Figure 6:
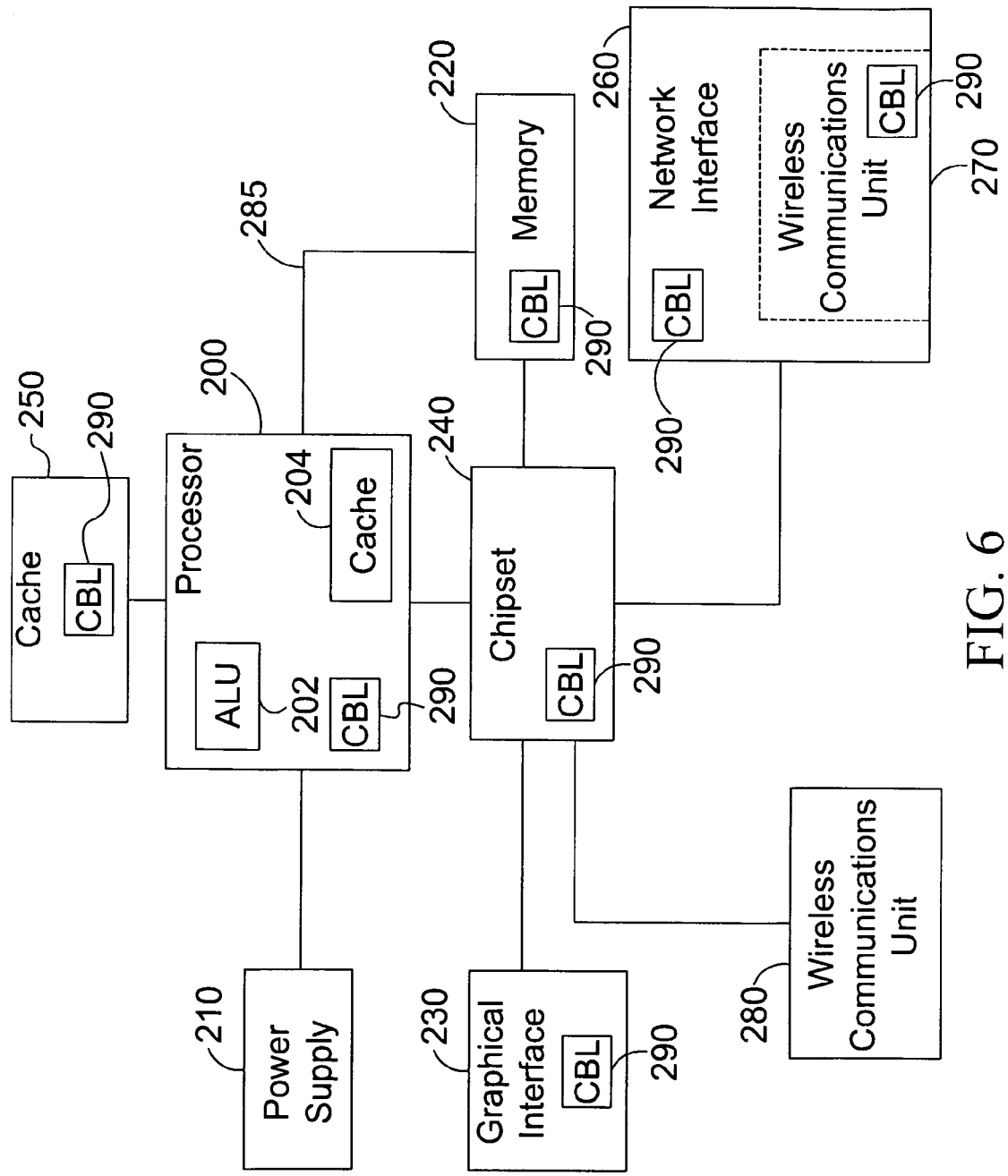
FIG. 6 is a diagram of a system which includes or may be coupled to a current-balanced logic circuit in accordance with one embodiment of the present invention.

FIG. 6 shows a system which includes a processor 200, a power supply 210, and a memory 220 which, for example, may be a random-access memory. The processor includes an arithmetic logic unit 202 and an internal cache 204. The system may also include a graphical interface 230, a chipset 240, a cache 250, a network interface 260, and a wireless communications unit 270, which may be incorporated within the network interface. Alternatively, or additionally, the communications unit 280 may be coupled to the processor, and a direct connection 285 may exist between memory 220 and the processor as well. This connection and the connections between and among the other blocks of the system may be formed by metal interconnect structures resulting from one or more of the processes described herein. According to another alternative, a host-bus concept may be replaced by an architecture that incorporates the chipset, memory, and/or one or more of the other features into the functionality of the processor. Also, such a bus may be replaced by one or more point-to-point interconnects between or among the features shown in FIG. 6.

The processor may be a microprocessor or any other type of processor, and may be included on a chip die with all or any combination of the remaining features, or one or more of the remaining features may be electrically coupled to the microprocessor die through known connections and interfaces. Also, the connections that are shown are merely illustrative, as other connections between or among the elements depicted may exist depending, for example, on chip platform, functionality, or application requirements.

A current-balanced logic circuit (CBL) 290 in accordance with any of the embodiments of the present invention may be included, for example, in any one or more of the interface circuits shown in FIG. 6. These circuits include graphical interface 230, network interface 260, and wireless communications units 270 and 280. Examples of specific types of interface circuits include a CSI-type interface (e.g., an interface between the processor and the chipset), a SATA-type interface (e.g., an interface between a South Bridge (ICH-I/O control hub) and the disk drive) or a PCI-Express-type interface (e.g., an interface between the chipset and communication units, or chipset and external peripherals).

Additionally, or alternatively, the current-balanced logic circuit may be included in any of the memory or cache circuits or even the chipset for purposes of storing data.

When implemented in this manner, the current-balanced logic circuit may, for example, store data to be sent to or received from another one of the circuits shown in FIG. 6. For example, when included in network interface 260, the current-balanced logic circuit may store data received from an external source (e.g., via wireless communication unit 270) for transmission to processor 200, for example, through chipset 240. When included in memory 220, the current-balanced logic circuit may store data to be output to wireless communication unit 280, for example, through the chipset. Additional non-limiting examples contemplate the use of the current-mode logic circuit to store data conveyed between and among other circuits shown in FIG. 6.

The foregoing embodiments of the present invention may be varied. For example, the first and second current mode logic circuits may receive the same differential data signals or those signals may be different. When the same differential signals are input into the current mode logic circuits, the data may be demultiplexed at half the input data rate which may prove suitable for some applications. This demultiplexing operation is achieved based on the complementary phases of the clock signals, which enable storage of consequent bits at the outputs of the storage stages.

Thus, for example, consider the case where an input data stream includes the following bits: 001110111010010. This stream is effectively demultiplexed into outputs of storage stages I and II at half the data rate, e.g., storage stage I will output bits 01111100 and storage stage II will output 0101001. The original data sequence may be recovered by alternately selecting and then interlacing outputs of the stages. As a result a clock rate (e.g., 4.25 GHz) equal to half the input data rate (e.g., 8.5 Gb/s) may be realized, which corresponds, for example, to only half a clock period per data bit. This may result in substantial power savings and an improvement in the ease of implementation because full-rate clock signals are not required to be routed throughout the circuit.

In other embodiments, the first and second current mode logic circuits may receive different differential data signals. However, unlike the previous embodiment, the clock signals may have to be applied at full rate; otherwise the flip-flop may start missing bits. This embodiment may work as a multiplexer, in effect doubling the data rate. In other words, data into the first storage stage would be sampled in the positive half of the clock cycle, and data into the second storage stage would be sampled in the negative half of the clock cycle. The two outputs would then be combined.

According to another variation, the current-balanced logic circuit may have more than two stages which receive bias or reference current under the control of a single current controller or current-source transistor.

Any reference in this specification to an "embodiment" means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Furthermore, for ease of understanding, certain functional blocks may have been delineated as separate blocks; however, these separately delineated blocks should not necessarily be construed as being in the order in which they are discussed or otherwise presented herein. For example, some blocks may be able to be performed in an alternative ordering, simultaneously, etc.

Although the present invention has been described herein with reference to a number of illustrative embodiments, it should be understood that numerous other variations and embodiments can be devised by those skilled in the art that will fall within the spirit and scope of the principles of this invention. More particularly, reasonable variations are possible in the component parts and/or arrangements of the subject combination arrangement within the scope of the foregoing disclosure, the drawings and the appended claims without departing from the spirit of the embodiments of the invention.

We claim:

1. A circuit, comprising:
a first sense amplifier;
a second sense amplifier; and
a current-source transistor to provide bias current to the first and second sense amplifiers, the first and second sense amplifiers being alternately activated by first and second differential clock signals respectively, wherein:
the first sense amplifier includes differential output data lines which are driven to a same value when the first differential clock signal assumes a first logical value,
the second sense amplifier includes differential output data lines which are driven to a same value when the second differential clock signal assumes the first logical value, the circuit further comprising:
a first isolation circuit to drive the differential output data lines of the first sense amplifier to the same value when the first differential clock signal assumes the first logical value; and
a second isolation circuit to drive the differential output data lines of the second sense amplifier to the same value when the second differential clock signal assumes the first logical value.

2. The circuit of claim 1, wherein the current-source transistor is to provide substantially an equal amount of bias current to the first and second sense amplifiers.

3. The circuit of claim 1, wherein the first differential clock signal is to control flow of the bias current to the first sense amplifier, and the second differential clock signal is to control flow of the bias current to the second sense amplifier.

4. The circuit of claim 3, wherein the first sense amplifier is to convert first and second differential data signals into complementary logical values for output on said differential output data lines when the first differential clock signal assumes a second logical value, and
the second sense amplifier is to convert third and fourth differential data signals into complementary logical values for output on said differential output data lines when the second differential clock signal assumes the second logical value.

5. The circuit of claim 4, wherein the first and second differential data signals are same as the third and fourth differential data signals respectively.

6. The circuit of claim 1, wherein activation of the first and second isolation circuits are to be controlled by the first differential clock signal.

7. The circuit of claim 1, further comprising:
a first storage circuit to store an output of the first sense amplifier; and
a second storage circuit to store an output of the second sense amplifier.

8. A method, comprising:
supplying a bias current to a first sense amplifier; and
supplying the bias current to a second sense amplifier, the bias current alternately supplied to the first and second sense amplifiers based on first and second differential clock signals respectively, wherein the first and second differential clock signals activate corresponding ones of the first and second sense amplifiers, said method further comprising:
de-activating the first sense amplifier when the first differential clock signal assumes a first logical value, and activating the first sense amplifier when the first differential clock signal assumes a second logical value, and
de-activating the second sense amplifier when the second differential clock signal assumes the first logical value, and activating the second sense amplifier when the second differential clock signal assumes the second logical value, and wherein:
de-activating the first and second sense amplifiers respectively includes:
activating a first isolation circuit to drive differential data output lines to a same value when the first differential clock signal assumes the first logical value; and
activating a second isolation circuit to drive differential data output lines to a same value when the second differential clock signal assumes the first logical value.

9. The method of claim 8, further comprising:
storing an output of the first sense amplifier in a first storage circuit, the output of the first sense amplifier based on a first differential data signal; and
storing an output of the second sense amplifier in a second storage circuit, the output of the second sense amplifier based on a second differential data signal.

10. The method of claim 9, wherein the first differential data signal is equal to the second differential data signal.

11. A system, comprising:
a first circuit
a current-mode logic circuit in the first circuit and comprising:
(a) a first sense amplifier;
(b) a second sense amplifier; and
(c) a current controller to balance bias current between the first and second sense amplifiers, the first and second sense amplifiers alternately controlled by first and second differential clock signals respectively, wherein:
the first sense amplifier includes differential output data lines which are driven to a same value when the first differential clock signal assumes a first logical value,
the second sense amplifier includes differential output data lines which are driven to a same value when the second differential clock signal assumes the first logical value, the circuit further comprising:
a first isolation circuit to drive the differential output data lines of the first sense amplifier to the same value when the first differential clock signal assumes the first logical value; and
a second isolation circuit to drive the differential output data lines of the second sense amplifier to the same value when the second differential clock signal assumes the first logical value.

12. The system of claim 11, wherein the first circuit is to supply differential data signals to the first and second sense amplifiers.

13. The system of claim 11, wherein the first circuit is an interface, cache, memory, communications unit, or chipset.

* * * * *